(12) United States Patent
Tanaka

(10) Patent No.: US 7,940,353 B2
(45) Date of Patent: May 10, 2011

(54) LIQUID CRYSTAL DISPLAY DEVICE

(75) Inventor: Kazuya Tanaka, Osaka (JP)

(73) Assignee: Funai Electric Co., Ltd., Osaka (JP)

( * ) Notice: Subject to any disclaimer, the term of this patent is extended or adjusted under 35 U.S.C. 154(b) by 427 days.

(21) Appl. No.: 12/037,994

(22) Filed: Feb. 27, 2008

(65) Prior Publication Data

US 2008/0204623 A1    Aug. 28, 2008

(30) Foreign Application Priority Data

Feb. 28, 2007   (JP) .................................. 2007-048485

(51) Int. Cl.
*G02F 1/1335* (2006.01)

(52) U.S. Cl. .............. 349/65; 349/150; 349/58; 349/67; 362/631; 362/612; 362/615; 362/632; 361/749

(58) Field of Classification Search .................. 349/150, 349/65, 62, 69, 70, 58, 67; 362/612, 631, 362/615, 632–634; 361/749
See application file for complete search history.

(56) References Cited

U.S. PATENT DOCUMENTS

| | | | |
|---|---|---|---|
| 7,192,177 B2 * | 3/2007 | Chang et al. .................. | 362/631 |
| 7,319,498 B2 * | 1/2008 | Sakurai et al. ................. | 349/58 |
| 7,359,012 B2 * | 4/2008 | Ishiwa et al. ................... | 349/65 |
| 7,641,376 B2 * | 1/2010 | Sakai et al. .................... | 362/623 |
| 7,695,178 B2 * | 4/2010 | Suh et al. ...................... | 362/612 |
| 2007/0030700 A1 | 2/2007 | Pan | |

FOREIGN PATENT DOCUMENTS

| | | |
|---|---|---|
| JP | 2004-258060 A | 9/2004 |
| JP | 2000-173302 A | 6/2005 |
| JP | 2006-139020 A | 6/2006 |
| JP | 2007-041263 A | 2/2007 |
| JP | 2007-127742 A | 5/2007 |

* cited by examiner

*Primary Examiner* — Thoi V Duong
(74) *Attorney, Agent, or Firm* — Global IP Counselors

(57) ABSTRACT

A liquid crystal display device includes a liquid crystal cell, a light source, a light guide plate, a first flexible printed cable and a second flexible printed cable. The light source emits light. The light guide plate guides the light to illuminate the liquid crystal cell. The first flexible printed cable is electrically coupled to the liquid crystal cell. The second flexible printed cable is electrically coupled between the light source and the first flexible printed cable. The second flexible printed cable has a printed circuit, a first insulating film formed on one side of the printed circuit and a second insulating film formed on the other side of the printed circuit. The printed circuit is partially exposed on the one side of the printed circuit to form a first land that is electrically coupled to the light source and a second land that is electrically coupled to the first flexible printed cable.

10 Claims, 8 Drawing Sheets

LIQUID CRYSTAL DISPLAY DEVICE

CROSS-REFERENCE TO RELATED APPLICATIONS

This application claims priority to Japanese Patent Application No. 2007-048485 filed on Feb. 28, 2007. The entire disclosure of Japanese Patent Application No. 2007-048485 is hereby incorporated herein by reference.

BACKGROUND OF THE INVENTION

1. Field of the Invention

The present invention generally relates to a liquid crystal display device. More specifically, the present invention relates to a liquid crystal display device having a flexible printed cable.

2. Background Information

As shown in FIGS. 6 to 8, a conventional liquid crystal display device includes a frame 101, a liquid crystal cell 102, a light guide plate 103, a metal bezel 105, a polarizing plate 115, a prism sheet 116, a diffusion sheet 117 and a reinforcing plate 118. The frame 101 is made of a synthetic resin and is open at a front face. The frame 101 includes a base plate 101a and upper, lower, left, and right side plates 101b to 101e protruding integrally from outer peripheral edges of the base plate 101a. A liquid crystal cell 102 and a light guide plate 103 are disposed within the frame 101. The light guide plate 103 is made of an acrylic resin or other such translucent resin. Light emitting diodes (LEDs) are disposed in a gap 104 formed between the light guide plate 103 and the lower side plate 101c of the frame 101. Latching tabs 106 protrude integrally from outer peripheral faces of the side plates 101b to 101e. The latching tabs 106 are engaged in latching holes 105a formed in the side plates of the metal bezel 105. The metal bezel 105 is removably fitted to the frame 101 in a state of holding down outer peripheral edge of the liquid crystal cell 102.

A cell drive-use lead wire 107 and a lighting-use lead wire 108 are extended to outside the frame 101. The cell drive-use lead wire 107 includes a flexible printed cable electrically coupled to the liquid crystal cell 102. The lighting-use lead wire 108 includes a flexible printed cable electrically coupled to the LEDs. Furthermore, one end of the lighting-use lead wire 108 is electrically coupled to the cell drive-use lead wire 107.

As shown in FIGS. 8A and 8B, the lighting-use lead wire 108 is formed in a T shape by a lead wire main body 108a and an extension wire 108b. The lead wire main body 108a is for mounting the LEDs. The extension wire 108b protrudes integrally from the lead wire main body 108a. The lead wire main body 108a and the extension wire 108b include a printed circuit 111 and two insulating films 109 and 110 formed on both sides of the printed circuit 111. One insulating film 109 is partially removed to expose lands 111a of the printed circuit 111 in a middle portion and at both ends of the lead wire main body 108a. The LEDs are attached with solder S to the lands 111a. The other insulating film 110 is also partially removed to expose lands 111b of the printed circuit 111 at the end of the extension wire 108b.

As shown in FIG. 7, the LEDs are affixed to a rear face of the liquid crystal cell 102 by a double-sided adhesive 113 via the lead wire main body 108a and a light blocking tape 112 in order to fix the LEDs at proper locations within the gap 104.

As shown in FIG. 7, the cell drive-use lead wire 107 has the same structure as the lighting-use lead wire 108. The lands 111b of the extension wire 108b are connected to the lands 111c of the printed circuit 111, which are exposed by partially removing the insulating film 109 of the cell drive-use lead wire 107. The reinforcing plate 118 is made of a synthetic resin and fastened to the end of the cell drive-use lead wire 107.

The cell drive-use lead wire 107 is connected to a drive circuit via a connector 114 to emit light from the LEDs. The emitted light goes through the light guide plate 103 and illuminates the liquid crystal cell 102 from behind. Japanese Laid-Open Patent Application No. 2005-173302 discloses a liquid crystal display device having a similar structure.

With the conventional liquid crystal display device, not only the insulating film 109 formed on one side of the printed circuit 111, but also the insulating film 110 formed on the other side of the printed circuit 111 has to be partially removed to expose the lands 111a and 111b. Thus, the number of process to produce the conventional liquid crystal display device is increased, which correspondingly increase the production expense.

In view of the above, it will be apparent to those skilled in the art from this disclosure that there exists a need for an improved liquid crystal display device. This invention addresses this need in the art as well as other needs, which will become apparent to those skilled in the art from this disclosure.

SUMMARY OF THE INVENTION

The present invention was conceived in light of the above-mentioned problems. One object of the present invention is to provide a liquid crystal display device in which the process to produce the liquid crystal display device is simplified.

In accordance with one aspect of the present invention, a liquid crystal display device includes a liquid crystal cell, a light source, a light guide plate, a first flexible printed cable and a second flexible printed cable. The light source is configured to emit light. The light guide plate is configured to guide the light to illuminate the liquid crystal cell. The first flexible printed cable is electrically coupled to the liquid crystal cell. The second flexible printed cable is electrically coupled between the light source and the first flexible printed cable. The second flexible printed cable has a printed circuit, a first insulating film formed on one side of the printed circuit and a second insulating film formed on the other side of the printed circuit. The printed circuit is partially exposed on the one side of the printed circuit to form a first land that is electrically coupled to the light source and a second land that is electrically coupled to the first flexible printed cable.

These and other objects, features, aspects and advantages of the present invention will become apparent to those skilled in the art from the following detailed description, which, taken in conjunction with the annexed drawings, discloses selected embodiments of the present invention.

BRIEF DESCRIPTION OF THE DRAWINGS

Referring now to the attached drawings which form a part of this original disclosure.

DETAILED DESCRIPTION OF THE PREFERRED EMBODIMENTS

Figure 1:
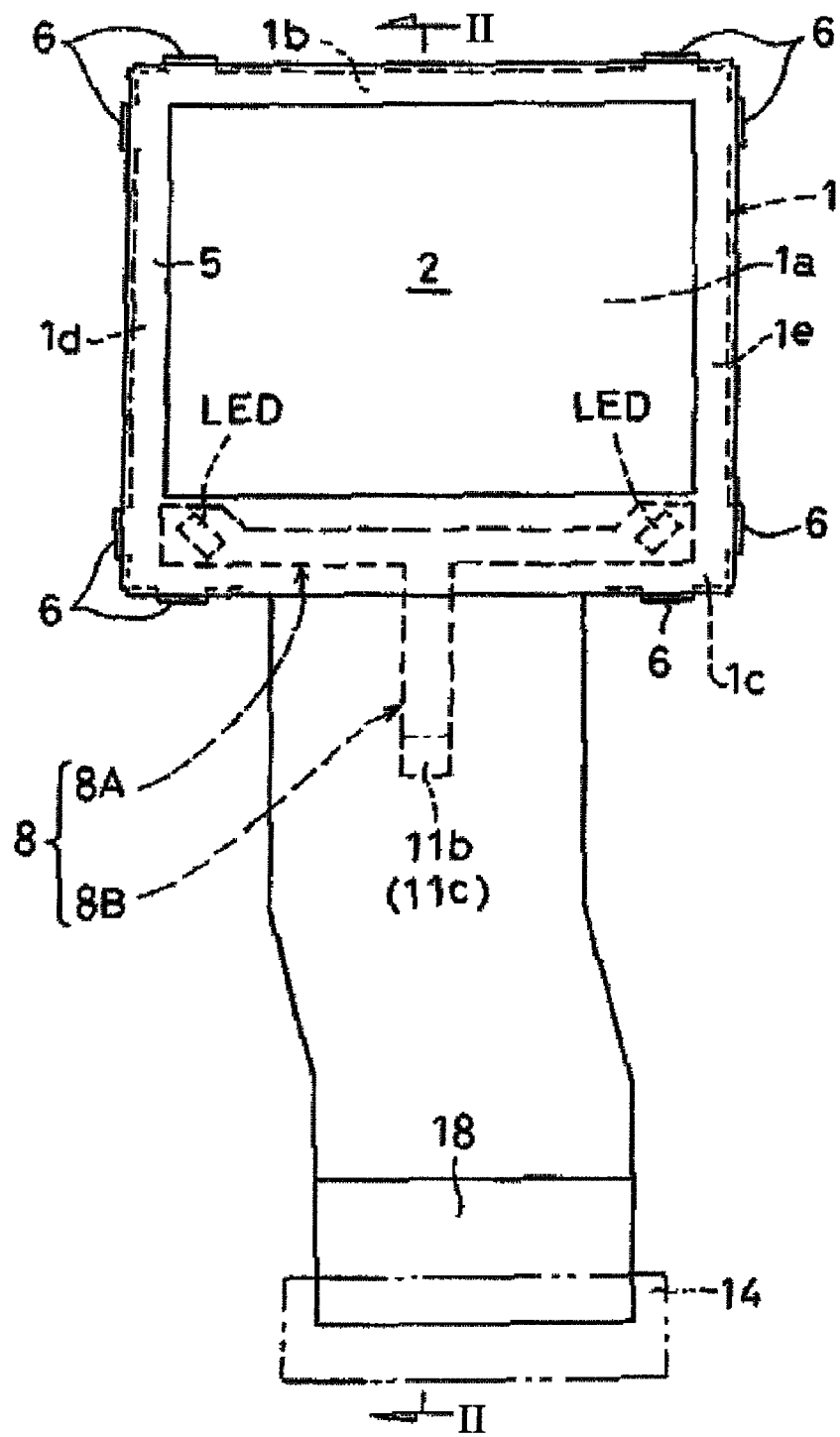
FIG. 1 is a front elevational view of a liquid crystal display device in accordance with one embodiment of the present invention.

A preferred embodiment of the present invention will now be explained with reference to the drawings. It will be apparent to those skilled in the art from this disclosure that the following description of the preferred embodiment of the present invention is provided for illustration only and not for the purpose of limiting the invention as defined by the appended claims and their equivalents.

FIGS. 1 to 5 illustrate a liquid crystal display device in accordance with one embodiment of the present invention. The liquid crystal display device is used, for example, as a display component of a laser printer.

As shown in FIGS. 1 to 5, the liquid crystal display device includes a frame 1, a liquid crystal cell (e.g., electric component means) 2, a light guide plate (e.g., light guide means) 3, a metal bezel 5, a cell drive-use lead wire (e.g., first flexible printed cable or first electric connection means) 7, a lighting-use lead wire (e.g., second flexible printed cable or second electric connection means) 8, a plurality of light emitting diodes (e.g., light source or light emitting means) LEDs, a polarizing plate 15, a prism sheet 16, a diffusion sheet 17 and a reinforcing plate 18. The frame 1 is made of a synthetic resin and is open at a front face. The frame 1 includes a base plate 1a and upper, lower, left, and right side plates 1b to 1e protruding integrally from outer peripheral edges of the base plate 1a. The liquid crystal cell 2 and the light guide plate 3 are disposed within the frame 1. Latching tabs 6 protrude integrally from outer peripheral faces of the side plates 1b to 1e. The latching tabs 6 are engaged in latching holes 5a formed in the side plates of the metal bezel 5. The metal bezel 5 is removably fitted to the frame 1 in a state of holding down outer peripheral edge of the liquid crystal cell 2.

The cell drive-use lead wire 7 and the lighting-use lead wire 8 are extended to outside the frame 1. The cell drive-use lead wire 7 includes a flexible printed cable electrically coupled to the liquid crystal cell 2. The lighting-use lead wire 8 includes a flexible printed cable electrically coupled to light emitting diodes (LEDs). Furthermore, one end of the lighting-use lead wire 8 is electrically coupled to the cell drive-use lead wire 7.

Figure 5A:
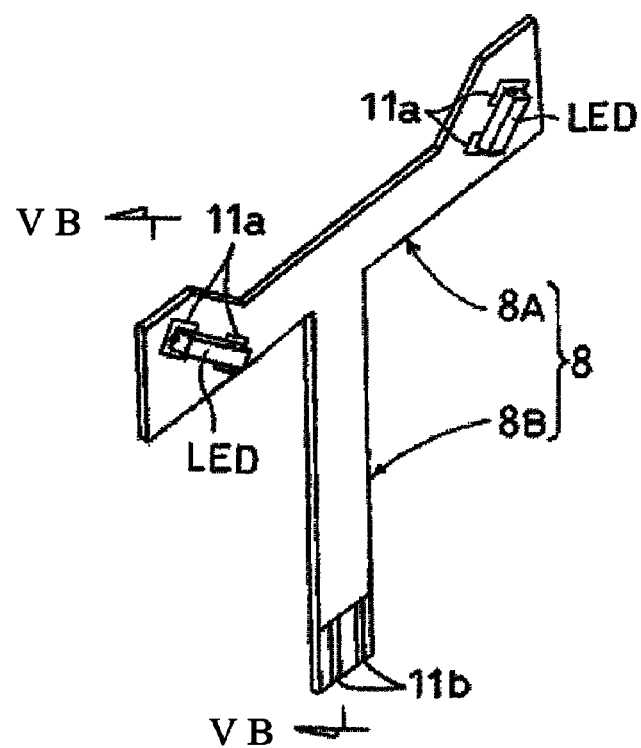
FIG. 5A is a perspective view of a flexible printed circuit of the liquid crystal display device illustrated in FIG. 1.

As shown in FIG. 5A, the lighting-use lead wire 8 is formed in a T shape by a lead wire main body (e.g., main portion) 8a and an extension wire (e.g., extension portion) 8b. The lead wire main body 8a is used for mounting the LEDs. The extension wire 8b extends integrally from the lead wire main body 8a. The lead wire main body 8a and the extension wire 8b include a printed circuit 11 and two insulating films (e.g., first and second insulating films) 9 and 10 formed on both sides of the printed circuit 11.

Figure 4:
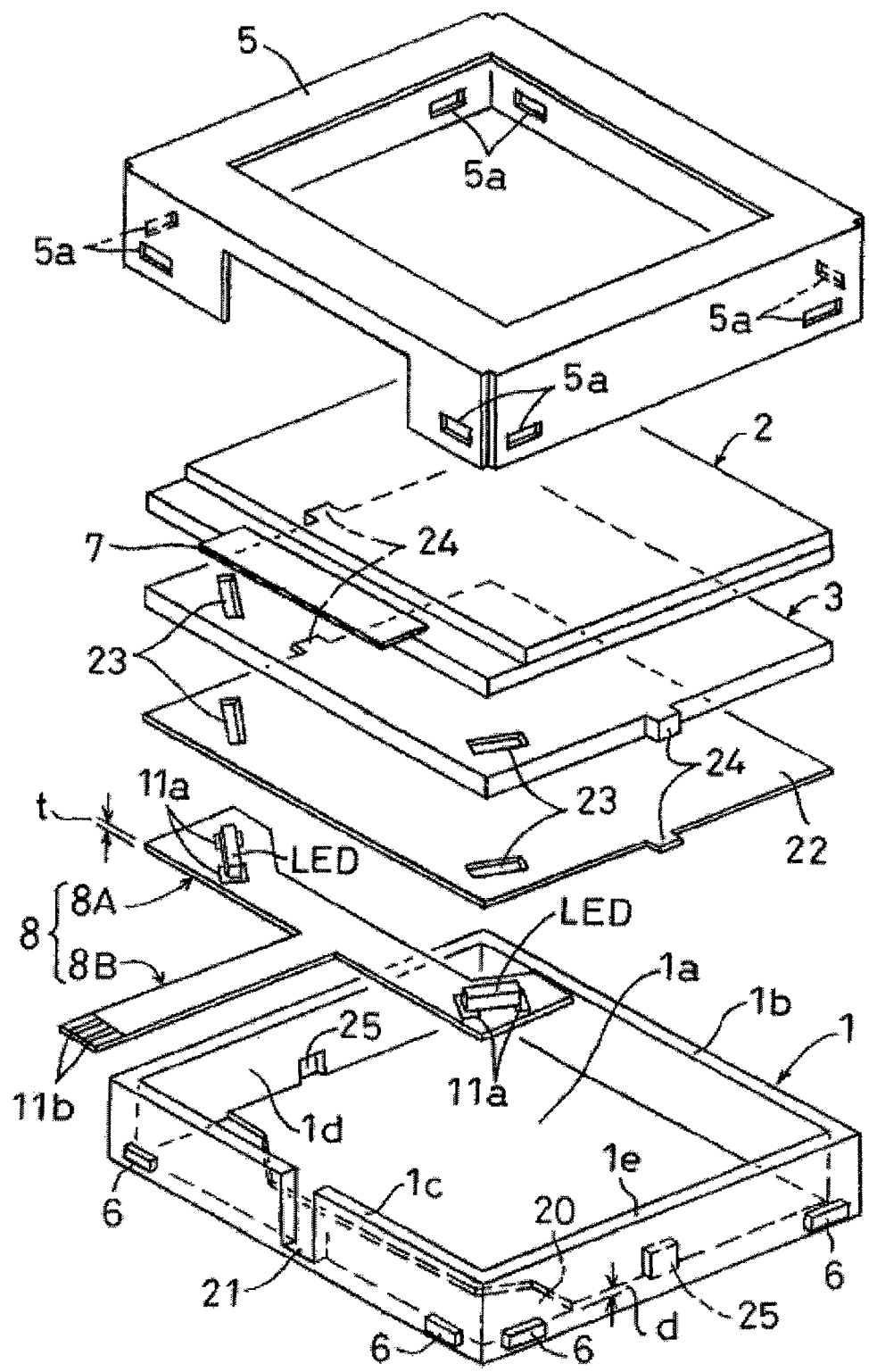
FIG. 4 is an exploded perspective view of the liquid crystal display device illustrated in FIG. 1.

The LEDs include a pair of left and right LEDs provided at two lateral ends of the lead wire main body 8a of the lighting-use lead wire 8. The LEDs are disposed on the lead wire main body 8a so that the LEDs protrude frontward from the lead wire main body 8a. A groove (e.g., groove portion) 20 is formed in a bottom face of the base plate 1a, along the lower plate 1c of the frame 1 and opposite the lead wire main body 8a. As shown in FIG. 4, a depth d of the groove 20 is set substantially equal to a thickness t of the lead wire main body 8a. Furthermore, an insertion recess (e.g., access portion) 21 for inserting the extension wire 8b is formed in the lower plate 1c.

The light guide plate 3 is made of an acrylic resin or other such translucent resin. A reflective sheet 22 is disposed on a rear face of the light guide plate 3. The reflective sheet 22 has substantially the same shape as the light guide plate 3. Each of the light guide plate 3 and the reflective sheet 22 includes fitting holes (e.g., fitting hole portion) 23 and a pair of left and right hook components 24. The fitting holes 23 are formed in the light guide plate 3 and the reflective sheet 22 so that each of the LEDs is fitted in the fitting holes 23 from a rear side of the light guide plate 3 and the reflective sheet 22.

The left and right hook components (e.g., hook portion) 24 protrude integrally from side edges of the light guide plate 3 and the reflective sheet 22. The left and right hook components 24 engage engagement recesses 25 formed in inner peripheral faces of the left and right side plates 1d and 1e of the frame 1.

Figure 2:
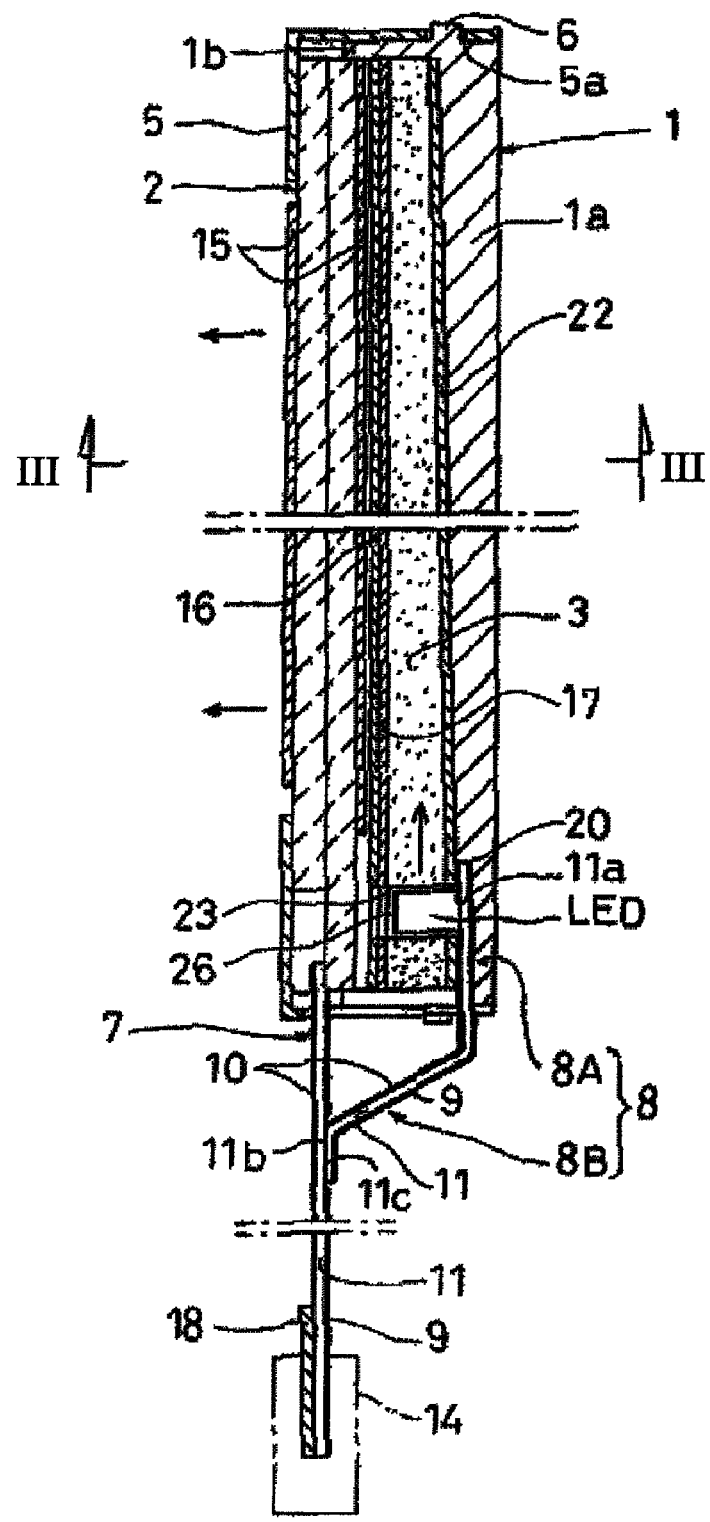
FIG. 2 is a cross sectional view of the liquid crystal display device taken along II-II line shown in FIG. 1.
Figure 3:
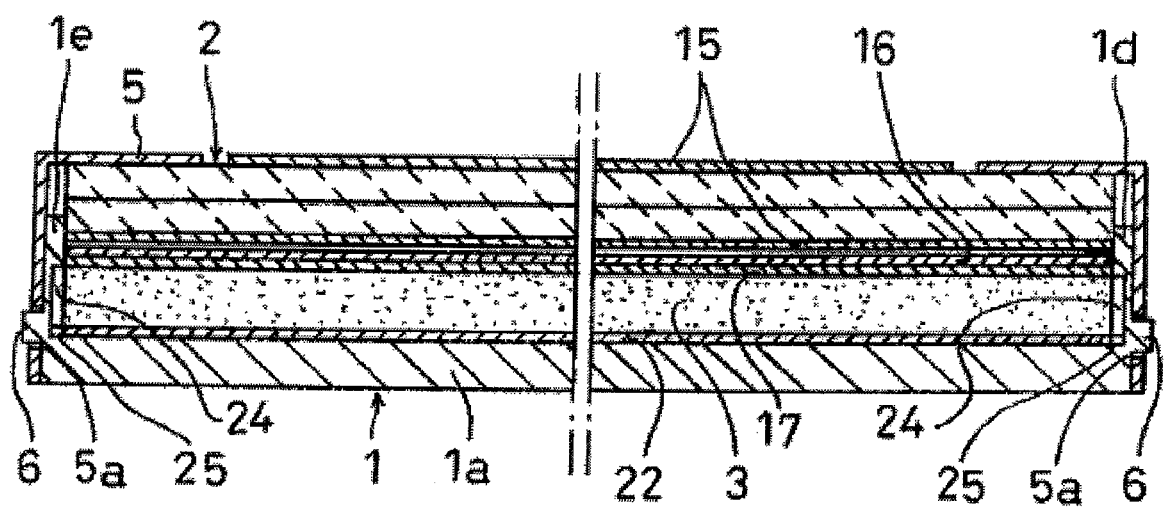
FIG. 3 is a cross sectional view of the liquid crystal display device taken along III-III line shown in FIG. 2.
Figure 5B:
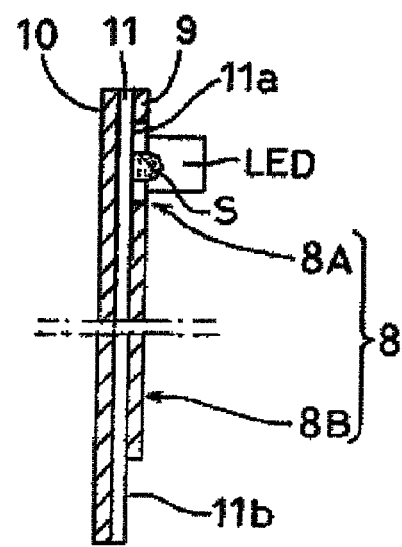
FIG. 5B is a cross sectional view of the liquid crystal display device taken along VB-VB line shown in FIG. 5A.
Figure 6:
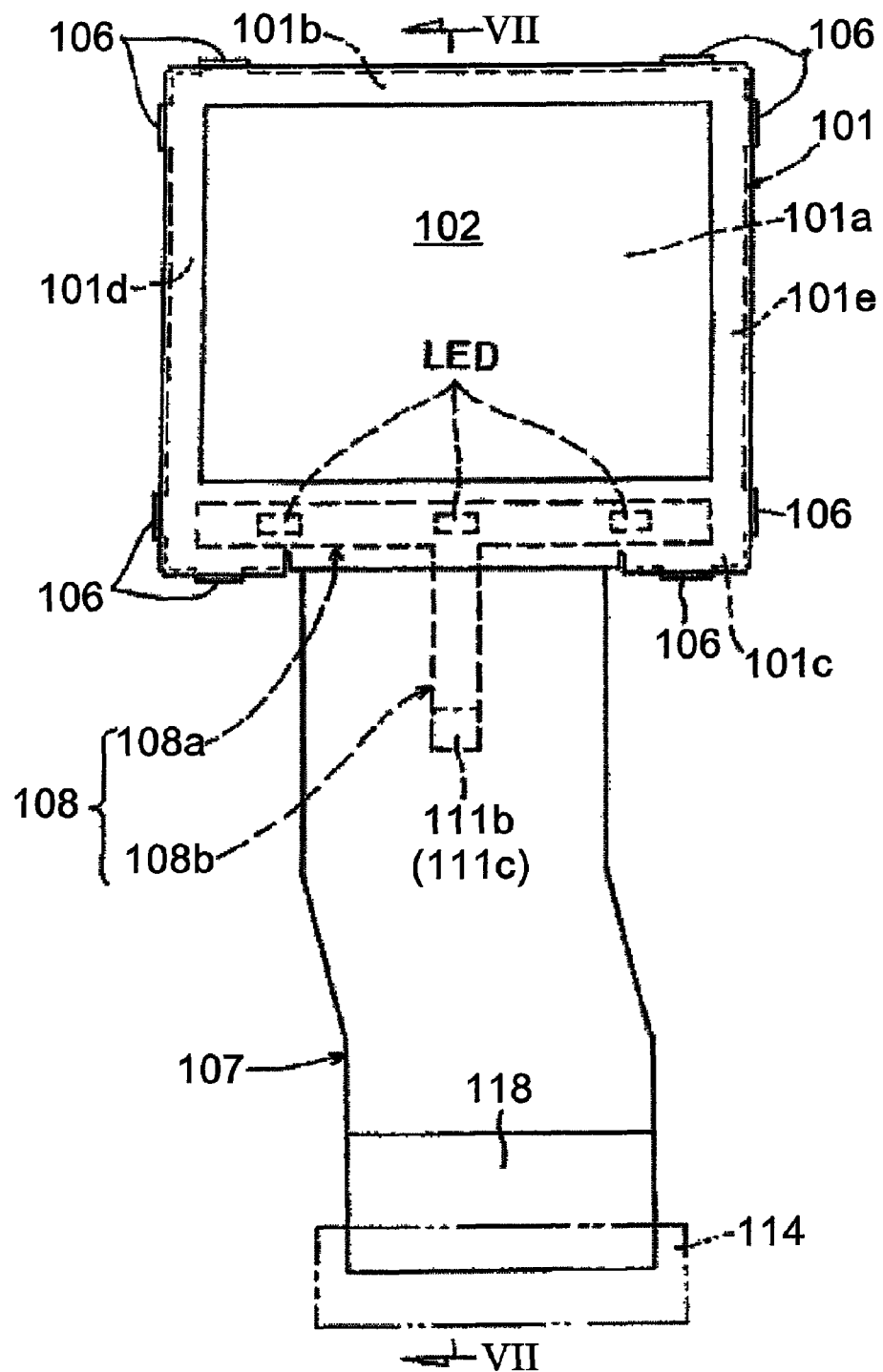
FIG. 6 is a front elevational view of a conventional liquid crystal display device.

As show in FIG. 5, lands (e.g., first and second lands or first and second electric coupling means) 11a and 11b of the printed circuit 11 are formed on only one side of the lighting-use lead wire 8 by partially removing the insulating film 9 formed on the one side of the printed circuit 11. In other words, the lands 11a and 11b are formed on the same side of the lighting-use lead wire 8. Specifically, the lands 11a are formed on the lead wire main body 8a at lateral ends of the lead wire main body 8a. The lands 11b are formed on the extension wire 8b at the end of the extension wire 8b. The LEDs are electrically coupled with solder S to the lands 11a of the lead wire main body 8a. The lands 11b of the extension wire 8b are electrically coupled to lands 11c formed on the cell drive-use lead wire 7. No removal work is performed on the insulating film 10. As shown in FIG. 2, a light blocking layer 26 is formed at front end faces of the LEDs so that light will not directly leak out from the front end faces of the LEDs to the front side of the liquid crystal display device.

The cell drive-use lead wire 7 has the same structure as the lighting-use lead wire 8. The lands 11b of the extension wire 8b are connected to the lands 11c of the printed circuit 11 exposed by partially removing the insulating film 9 of the cell drive-use lead wire 7. The reinforcing plate 18 is made of a synthetic resin and fastened to the end of the cell drive-use lead wire 7.

The assembly procedure will now be described. First, the lead wire main body 8a is fitted into the groove 20 with the LEDs facing the front side of the frame 1. The light guide plate 3 and the reflective sheet 22 are inserted in the frame 1 from the front side of the frame 1. The hook components 24 are engaged in the engagement recesses 25. Thus, the LEDs are fitted in the fitting holes 23 formed in the light guide plate 3 and the reflective sheet 22. As a result, the lead wire main body 8a is sandwiched between the light guide plate 3 and a bottom face of the groove 20. The liquid crystal cell 2 is inserted in the frame 1 from the front side of the frame 1. The bezel 5 is fitted to the frame 1. Then, the latching tabs 6 are engaged in the latching holes 5a of the bezel 5.

As shown in FIG. 2, the cell drive-use lead wire 7 is electrically coupled to a drive circuit (not shown) via a connector 14. The drive circuit drives the liquid crystal cell 2 and the LEDs. The LEDs are electrically coupled to the drive circuit via the cell drive-use lead wire 7 and the lighting-use lead wire 8 to emit the light. The emitted light goes through the light guide plate 3 and illuminates the liquid crystal cell 2 from behind. Specifically, the light guide plate 3 guides the emitted light and illuminates the liquid crystal cell 2 to display an image.

With the liquid crystal display device, the lead wire main body 8a is fitted into the groove 20. Then, the lead wire main body 8a is sandwiched between the light guide plate 3 and the bottom face of the groove 20. Thus, the LEDs and the lead wire main body 8a are securely fixed in specific positions. Since there is no need for special fixing means, such as the double-sided adhesive 113 shown in FIG. 7, as was required in the conventional liquid crystal display device for the fixing, there is a corresponding reduction in the number of parts and the production expense.

Figure 7:
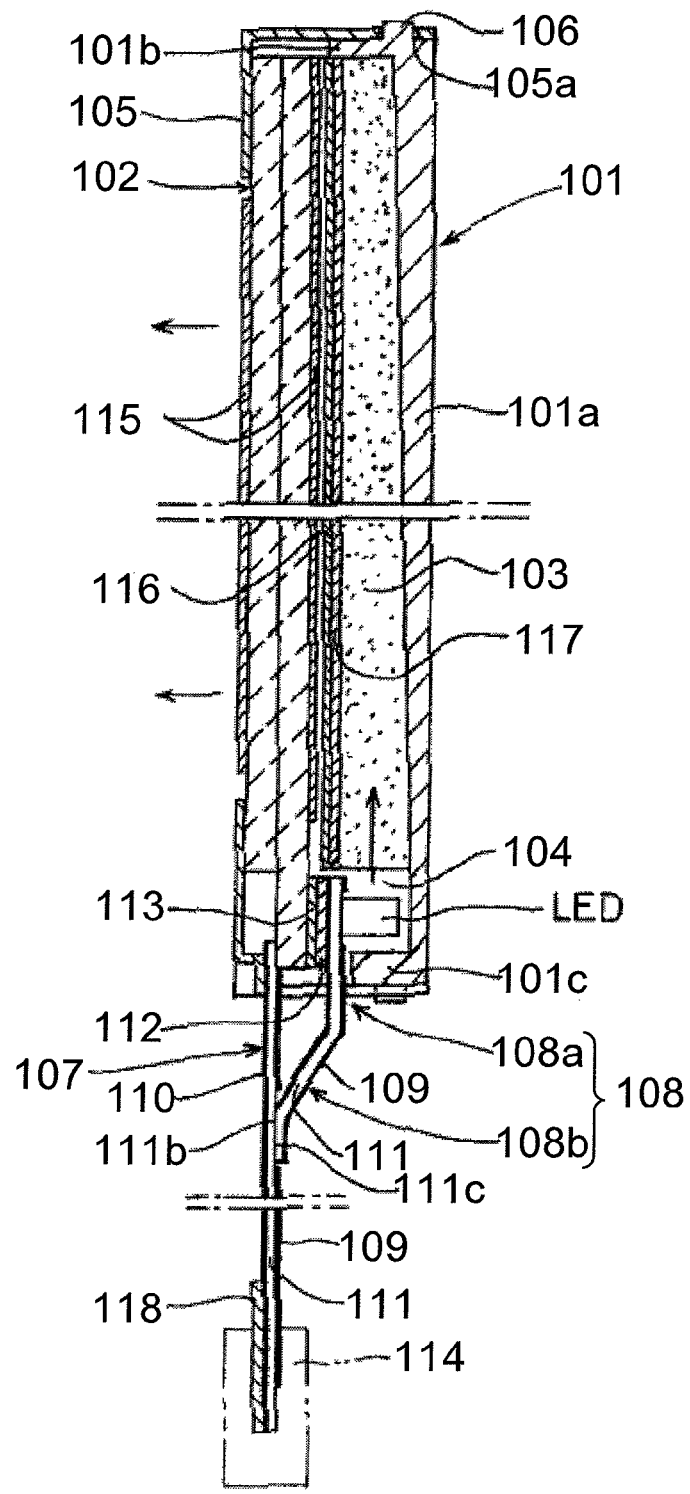
FIG. 7 is a cross sectional view of the conventional liquid crystal display device taken along VII-VII line shown in FIG. 6.
Figure 8A:
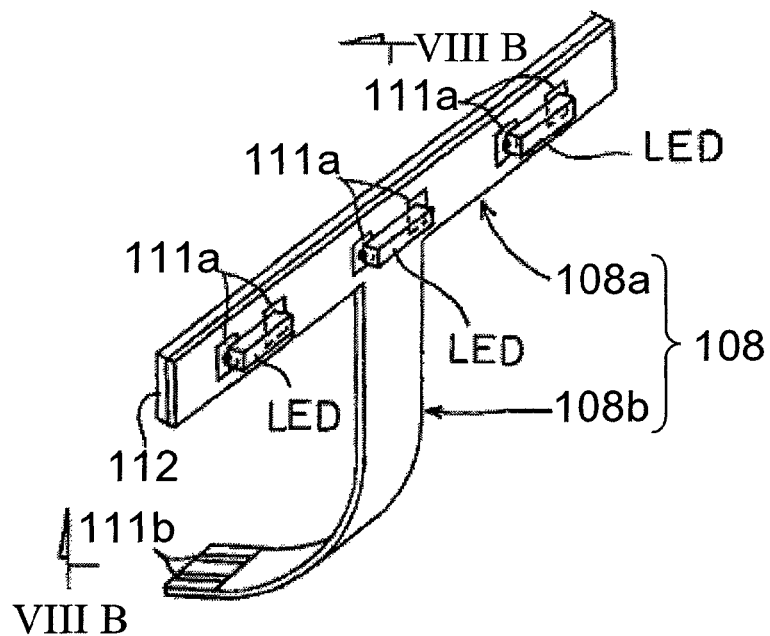
FIG. 8A is a perspective view of a flexible printed circuit of the conventional liquid crystal display device illustrated in FIG. 6.
Figure 8B:
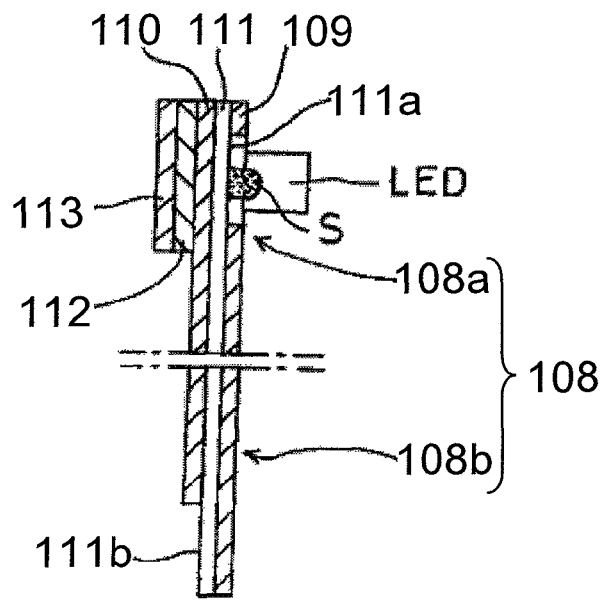
FIG. 8B is a cross sectional view of the conventional liquid crystal display device taken along VIIIB-VIIIB line shown in FIG. 8A.

With the liquid crystal display device, the LEDs are fitted into the fitting holes 23 of the light guide plate 3. Therefore, the light can be projected from the LEDs more efficiently and concentrated more toward the light guide plate 3. Also, the fitting holes 23 are formed only slightly larger than the LEDs. Thus, a gap formed between the fitting holes 23 and the LEDs become smaller. As a result, the leakage of the light leaked directly from the fitting holes 23 to the front side of the liquid crystal display device is substantially eliminated. Therefore, the light blocking tape 112 as shown in FIG. 7 can be omitted. Furthermore, the LEDs can be properly positioned and fixed with a simple structure. Moreover, there is a corresponding reduction in the number of parts and the production expense.

Furthermore, the light guide plate 3 is inserted in the frame 1 and fixed by engaging the hook components 24 in the engagement recesses 25. Thus, the lead wire main body 8a can be securely held down by the light guide plate 3. Furthermore, the light guide plate 3 can be prevented from accidentally coming out of the frame 1. Thus, assembly work can be performed more quickly and easily.

Moreover, the lands 11a and 11b are used for connecting the lighting-use lead wire 8 with the LEDs and the cell drive-use lead wire 7. The lands 11a and 11b are formed on the same side of the lighting-use lead wire 8. Thus, the lands 11a and 11b can be formed at the same time (with a single process) by partially removing the insulating film 9. Specifically, the lands 11a and 11b can be formed by partially removing the insulating film 9 located at the end of the extension wire 8b and at suitable locations of the lead wire main body 8a. Thus, there is no need as in the lighting-use lead wire 108 to partially remove both the insulating film 109 and the insulating film 110 to form the lands 111a and 111b. Therefore, the removal process only has to be performed for one insulating film. As a result, the number of process to produce the liquid crystal display device can be decreased.

General Interpretation of Terms

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts.

While only a preferred embodiment has been chosen to illustrate the present invention, it will be apparent to those skilled in the art from the disclosure that various changes and modifications can be made herein without departing from the scope of the invention as defined in the appended claims. Furthermore, the foregoing description of the preferred embodiment according to the present invention is provided for illustration only, and not for the purpose of limiting the invention as defined by the appended claims and their equivalents.

What is claimed is:

1. A liquid crystal display device comprising:
a liquid crystal cell;
a light source configured to emit light;
a light guide plate configured to guide the light to illuminate the liquid crystal cell;
a frame housing the liquid crystal cell, the light source and the light guide plate, the frame having a base plate with a groove portion;
a reflective sheet configured to reflect the light forward of the frame, the reflective sheet being disposed between the base plate of the frame and the light guide plate, the reflective sheet being directly disposed on a first bottom face of the base plate;
a first flexible printed cable electrically coupled to the liquid crystal cell; and
a second flexible printed cable electrically coupled between the light source and the first flexible printed cable, the second flexible printed cable having a printed circuit, a first insulating film formed on one side of the printed circuit and a second insulating film formed on the other side of the printed circuit, with the printed circuit being partially exposed on the one side of the printed circuit to form a first land that is electrically coupled to the light source and a second land that is electrically coupled to the first flexible printed cable,
the second flexible printed cable including a main portion on which the first land is formed and an extension portion on which the second land is formed, the extension portion extending from the main portion, the main portion being fitted in the groove portion and directly disposed on a second bottom face of the groove portion, the second bottom face of the groove portion being located rearward of the frame with respect to the first bottom face of the base plate.

2. The liquid crystal display device according to claim 1, wherein
the first insulating film is partially removed to expose the first and second lands.

3. The liquid crystal display device according to claim 2, wherein
the first flexible printed cable is electrically coupled between the liquid crystal cell and a drive circuit that is configured to drive the liquid crystal cell and the light source,
the light source is configured to be driven by the drive circuit via the second flexible printed cable.

4. The liquid crystal display device according to claim 3, wherein
the second land is formed at an end of the extension portion.

5. The liquid crystal display device according to claim 4, further comprising
a bezel removably attached to the frame to hold the liquid crystal cell from a front side of the liquid crystal cell.

6. The liquid crystal display device according to claim 5, wherein
   the frame have an access portion formed in a lower plate of the frame, and
   the extension portion of the second flexible printed cable extends through the access portion.

7. The liquid crystal display device according to claim 5, wherein
   the frame includes an engagement recess formed in an inner peripheral face of the frame, and
   the light guide plate includes a hook portion protruding from an outer peripheral portion of the light guide plate and engaging the engagement recess of the frame.

8. The liquid crystal display device according to claim 1, wherein
   the light guide plate includes a fitting hole portion, and
   the light source is fitted into the fitting hole portion.

9. The liquid crystal display device according to claim 1, wherein
   the reflective sheet has a fitting hole through which the light source is disposed.

10. A liquid crystal display device comprising:
    electric component means for displaying an image;
    light emitting means for emitting light;
    light guide means for guiding the light to illuminate the electric component means;
    frame means for housing the electric component means, the light emitting means and the light guide means, the frame means having support means with groove means;
    light reflection means for reflecting the light forward of the frame means, the light reflection means being supported between the support means and the light guide means, the light reflection means being directly supported by a first support face of the support means;
    first electric connection means for electrically coupling to the electric component means; and
    second electric connection means for electrically coupling between the light emitting means and the first electric connection means, the second electric connection means having first electric coupling means being coupled to the light emitting means and second electric coupling means being coupled to the first electric connection means, the first electric coupling means and the second electric coupling means being formed on the same side of the second electric connection means, the second electric connection means including a main connection means on which the first electric coupling means is formed and an extension connection means on which the second electric coupling means is formed, the extension connection means extending from the main connection means, the main connection means being fitted in the groove means and directly supported by a second support face of the groove means, the second support face of the groove means being located rearward of the frame means with respect to the first support face of the support means.

* * * * *